(12) United States Patent
Wang et al.

(10) Patent No.: US 9,019,171 B2
(45) Date of Patent: Apr. 28, 2015

(54) ELECTRIC DEVICE WITH MULTI-SCREEN

(75) Inventors: Yi-Ching Wang, Hsinchu (TW);
Po-Wen Hsiao, Hsinchu (TW);
Ted-Hong Shinn, Hsinchu (TW);
Tzu-Ming Wang, Hsinchu (TW)

(73) Assignee: E Ink Holdings Inc., Hsinchu County (TW)

( * ) Notice: Subject to any disclaimer, the term of this patent is extended or adjusted under 35 U.S.C. 154(b) by 1339 days.

(21) Appl. No.: 12/407,990

(22) Filed: Mar. 20, 2009

(65) Prior Publication Data

US 2010/0177018 A1    Jul. 15, 2010

(30) Foreign Application Priority Data

Jan. 9, 2009   (TW) ................ 98100783 A

(51) Int. Cl.

| | |
|---|---|
| *G09G 5/00* | (2006.01) |
| *G09F 9/30* | (2006.01) |
| *G06F 1/16* | (2006.01) |
| *G06F 3/14* | (2006.01) |
| *G09F 9/35* | (2006.01) |
| *H04M 1/02* | (2006.01) |
| *G06F 3/147* | (2006.01) |

(Continued)

(52) U.S. Cl.
CPC ............ *G09F 9/30* (2013.01); *G06F 1/1601* (2013.01); *G06F 1/1615* (2013.01); *G06F 1/1641* (2013.01); *G06F 3/1431* (2013.01); *G09F 9/35* (2013.01); *H04M 1/0268* (2013.01); *G06F 3/147* (2013.01); *G09G 3/344* (2013.01); *G09G 2370/16* (2013.01); *G09G 2380/06* (2013.01); *H04M 2250/16* (2013.01); *H05K 1/148* (2013.01)

(58) Field of Classification Search
CPC ..... G06F 1/1654; G06F 1/1641; G06F 3/147; G09F 2011/0009
USPC ................................................. 345/1.1–3.4
See application file for complete search history.

(56) References Cited

U.S. PATENT DOCUMENTS

| | | | |
|---|---|---|---|
| 6,232,932 B1 * | 5/2001 | Thorner | 345/1.3 |
| 6,252,564 B1 * | 6/2001 | Albert et al. | 345/1.3 |

(Continued)

FOREIGN PATENT DOCUMENTS

| | | |
|---|---|---|
| CN | 1758093 A | 4/2006 |
| CN | 101115129 A | 1/2008 |

(Continued)

OTHER PUBLICATIONS

Machine English translation for JP 2002-357845, Apr. 26, 2012, pp. 1-4.*

(Continued)

*Primary Examiner* — Jimmy H Nguyen
(74) *Attorney, Agent, or Firm* — Chun-Ming Shih

(57) ABSTRACT

An electric device with multi-screen includes a plurality of display modules and a plurality of flexible printed circuit boards. The display modules are electrically connected to each other by the flexible circuit printed boards. The display modules may display different images simultaneously for providing user different purposes. Furthermore, the electric device with multi-screen not only uses flexible circuit printed boards for connecting the display modules, the flexible display panel may be used in the display modules, so that the portable electric device with multi-screen may be flexible and the applications thereof may be increased.

12 Claims, 12 Drawing Sheets

(51) Int. Cl.
*G09G 3/34* (2006.01)
*H05K 1/14* (2006.01)

(56) References Cited

U.S. PATENT DOCUMENTS

| | | | |
|---|---|---|---|
| 6,299,337 B1 * | 10/2001 | Bachl et al. | 362/545 |
| 2002/0196205 A1 | 12/2002 | Yamakado et al. | |
| 2003/0011534 A1 * | 1/2003 | Rengan et al. | 345/1.1 |
| 2003/0071832 A1 * | 4/2003 | Branson | 345/698 |
| 2004/0090417 A1 | 5/2004 | Amiri | |
| 2005/0174302 A1 | 8/2005 | Ishii | |
| 2007/0235548 A1 | 10/2007 | Singleton | |

FOREIGN PATENT DOCUMENTS

| | | |
|---|---|---|
| CN | 101149673 A | 3/2008 |
| DE | 602004008345 T2 | 5/2008 |
| JP | 04-044154 A | 2/1992 |
| JP | 05-066388 A | 3/1993 |
| JP | 09-311737 A | 12/1997 |
| JP | 10-198288 A | 7/1998 |
| JP | 2000-250064 A | 9/2000 |
| JP | 2000-258792 A | 9/2000 |
| JP | 2002328625 A | 11/2002 |
| JP | 2002357845 A | 12/2002 |
| JP | 2003-316290 A | 7/2003 |
| JP | 2008-152184 A | 3/2008 |
| TW | M295864 A | 8/2006 |

OTHER PUBLICATIONS

Office Action from Deutsches Patent Office dated Jan. 30, 2012.
Taiwan Official Action issued on Nov. 29, 2012.
English translation of the Japanese Office Action issued on Aug. 7, 2012.
English translation of the China Office Action issued on Nov. 17, 2011.

* cited by examiner

ELECTRIC DEVICE WITH MULTI-SCREEN

This application claims priority to a Taiwan application No. 098100783 filed Jan. 9, 2009.

BACKGROUND

1. Field of the Invention

The invention relates to an electric device, and more particular to an electric device with multi-screen.

2. Description of the Related Art

With progress of the flat display technique, more and more electrical products, especially portable electrical products such as mobile phones, e-books, digital cameras and personal digital assistants etc., are equipped with flat display apparatuses. The development trend of the portable electrical product is to achieve light weight and thin thickness, so the portable electrical product usually use the flat display with these features, such as liquid crystal display, organic electro-luminescence display, electro-phoretic display and electro-wetting display.

Among the aforementioned display, the liquid crystal display is gradually replaced by the electro-phoretic display with high power-saving. Therefore, it is one of the important directions of research and develop by the people skilled in this art that how to expand the functions and practicalities of electric device by the display with high power-saving.

BRIEF SUMMARY

The invention is directed to an electric device with multi-screen for displaying different images by different display panels.

The invention provides an electric device with multi-screen, comprising a plurality of display modules and a plurality of flexible printed circuit boards, wherein the display modules are electrically connected to each other by the flexible printed circuit boards.

In one embodiment of the invention, the display modules comprise a plurality of driving circuit boards and a plurality of display panels. Each driving circuit board has a driving circuit and each display panel is disposed on the corresponding one of driving circuit boards and electrically connected to the driving circuit.

In one embodiment of the invention, the display panels comprise at least a flexible display panel.

In one embodiment of the invention, the display panels comprise at least a reflective display panel such as electro-phoretic display panel, electro-wetting display panel or micro electro-mechanical system display panel.

In one embodiment of the invention, the display panels comprise at least a touch display panel.

In one embodiment of the invention, the electric device with multi-screen further comprises at least a radio frequency identification chip, disposed on the one of the driving circuit boards and electrically connected to the driving circuit of the driving circuit board.

In one embodiment of the invention, the display modules are electrically connected to each other as a collar by the flexible printed circuit boards.

In one embodiment of the invention, the amount of the display panels is less than the amount of the driving circuit boards.

In one embodiment of the invention, the electric device with multi-screen further comprises a flexible substrate and a plurality of driving circuits, wherein the driving circuits are formed on the flexible substrate and isolated by each other.

Furthermore, each display module is a display panel disposed above the corresponding one of the driving circuits respectively and electrically connected to the driving circuit.

In one embodiment of the invention, the display modules are connected to each other along a first direction. In another embodiment, the display modules are further connected to each other along a second direction. The first direction and the second direction may be perpendicular to each other.

In one embodiment of the invention, the electric device with multi-screen further comprises a controlling module connected between two of the display modules. The controlling module comprises a signal receiving unit, a signal processing unit, an image signal generating unit, at least a storage unit, and at least a signal transmitting unit. The signal receiving unit is used for receiving an input signal. The signal processing unit is used for generating a command based on the input signal. The image signal generating unit is used for generating at least an image signal based on the command, and then the image signal is stored in the storage unit. The signal transmitting unit is used for reading the image signal stored in the storage unit and transmitting the image signal to the corresponding display module.

In one embodiment of the invention, the controlling module further comprises a switch unit, used to electrically connect the signal transmitting unit to one of the display modules selectively.

In one embodiment of the invention, the controlling module comprises a plurality of storage units and a plurality of signal transmitting units, and each signal transmitting unit is electrically connected to the corresponding storage units.

In one embodiment of the invention, the signal receiving unit may be wireless signal receiver or wired signal receiver.

The display modules of the electric device with multi-screen of the invention are connected to each other by a plurality of flexible printed circuit boards for expanding the size of displaying. Each display module may display different images simultaneously for providing user different purposes and may display parts of single image. Moreover, the electric device with multi-screen of the present may be flexible in bending without damaging the display modules and circuits and the applications thereof may be increased.

In order to make the aforementioned and other objects, features and advantages of the invention comprehensible, preferred embodiments accompanied with figures are described in detail below.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The electric device with multi-screen of the invention mainly comprises a plurality of display modules and a plurality of flexible printed circuit boards, wherein the display modules are electrically connected to each other by the flexible printed circuit boards. Some embodiments with accompanying drawings are cited in the following to demonstrate the connection of the display modules.

Figure 1:
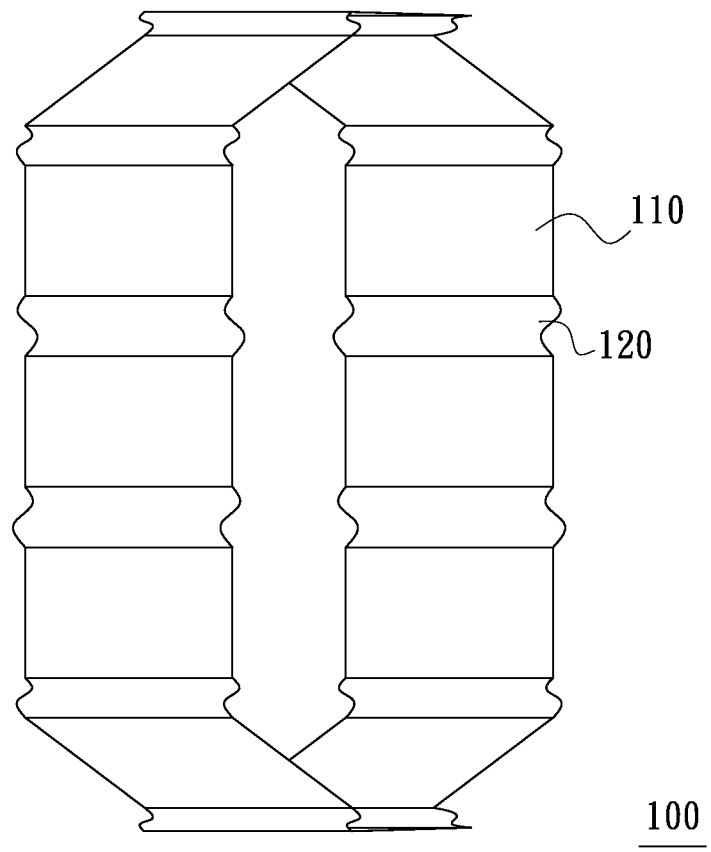
FIG. 1 is a schematic drawing of the electric device with multi-screen according to an embodiment of the invention.
Figure 2:
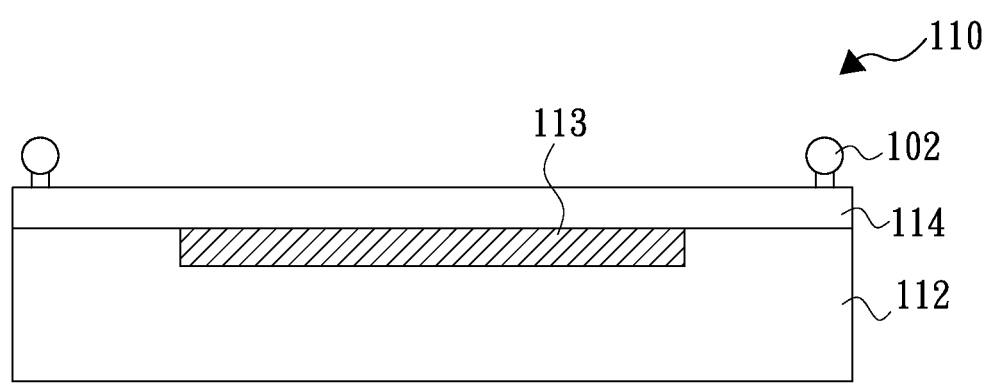
FIG. 2 is a schematic cross-sectional view of the display module of the electric device with multi-screen according to an embodiment of the invention.

FIG. 1 is a schematic drawing of the electric device with multi-screen of an embodiment of the invention. FIG. 2 is a schematic cross-sectional view of the display module of the electric device with multi-screen of the invention according to an embodiment. Referring to FIG. 1 and FIG. 2, the electric device with multi-screen 100 comprises a plurality of display modules 110 and a plurality of flexible printed circuit boards 120, wherein the display modules 110 comprise a plurality of driving circuit boards 112 and a plurality of display panels 114. Each driving circuit board 112 has a driving circuit 113 and each display panel 114 is electrically connected to the corresponding driving circuit board 112 and disposed thereon. The display panel 114 is driven by the driving circuit 113 of the driving circuit board 112. Specifically, the display panel 114 may be fixed on the driving circuit board 112 by screws 102 or other fixing members.

It should be noted that the size and the shape of the display panel 114 are not limited in the invention, and the size and the shape of the display panel 114 can be decided by those skilled in the art as preferred according to a necessary. Those modifications still fall within the scope of the invention.

Referring to FIG. 1, according to first embodiment of the invention, each flexible printed circuit board 120 is electrically connected between two display panels 110 for connecting the display modules 110 to each other as a collar. Furthermore, the display modules 110 may be flexible so the electric device with multi-screen 100 can be ring accessories, for example, belts, pendants or hand links.

Figure 3:
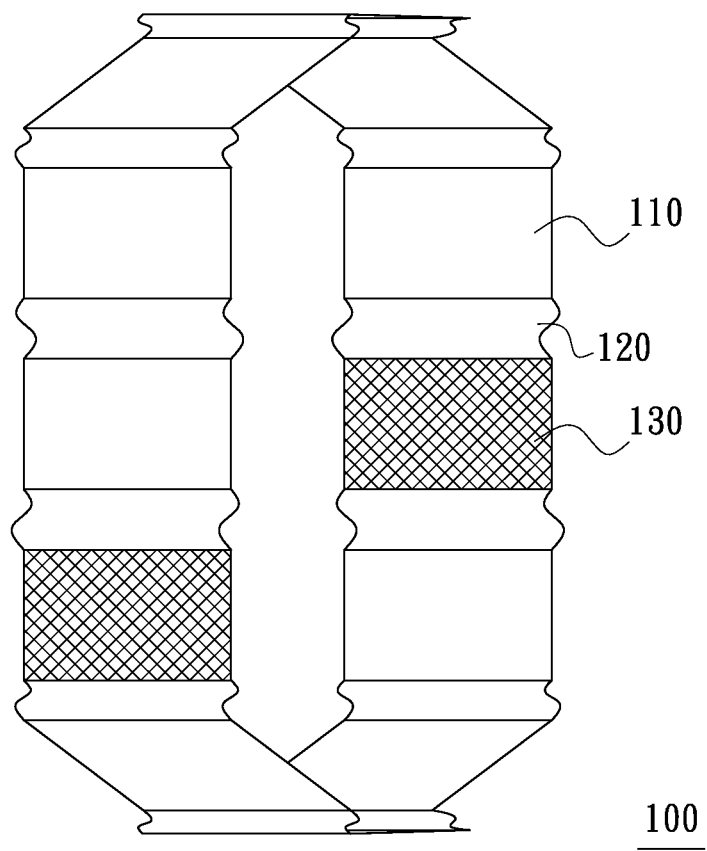
FIG. 3 is a schematic drawing of the electric device with multi-screen according to another embodiment of the invention.

It should be noted that the amount of the display panels 114 may be less than the amount of the driving circuit boards 112. In other words, there are not limited to dispose the display panels 114 on the whole driving circuit boards 112 in the invention. The users can add or remove the display panels 114 according to the actual requirement. Besides, the electric device with multi-screen 100 further comprises at least a decoration board 130 while the amount of the display panels 114 is less than the amount of the driving circuit boards 112 as shown in FIG. 3. The decoration board 130 is disposed on the driving circuit board 112, which the display panel 114 is not disposed thereon, to avoid the damage of the exposed driving circuit 113 on the driving circuit board 112. Furthermore, the design of the decoration board 130 also decorates the looks of the electric device with multi-screen 110.

Figure 4:
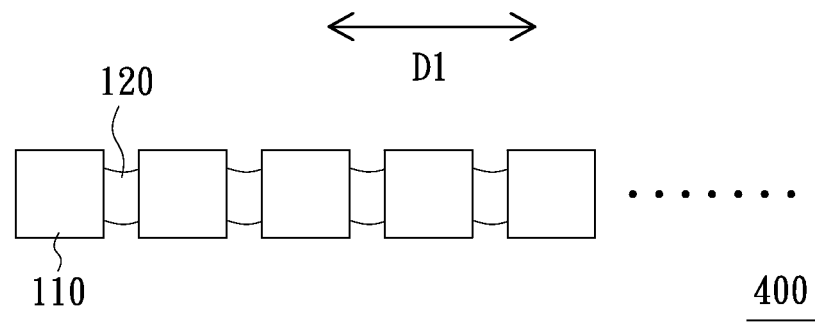
FIG. 4 is a schematic drawing of the electric device with multi-screen according to another embodiment of the invention.
Figure 5:
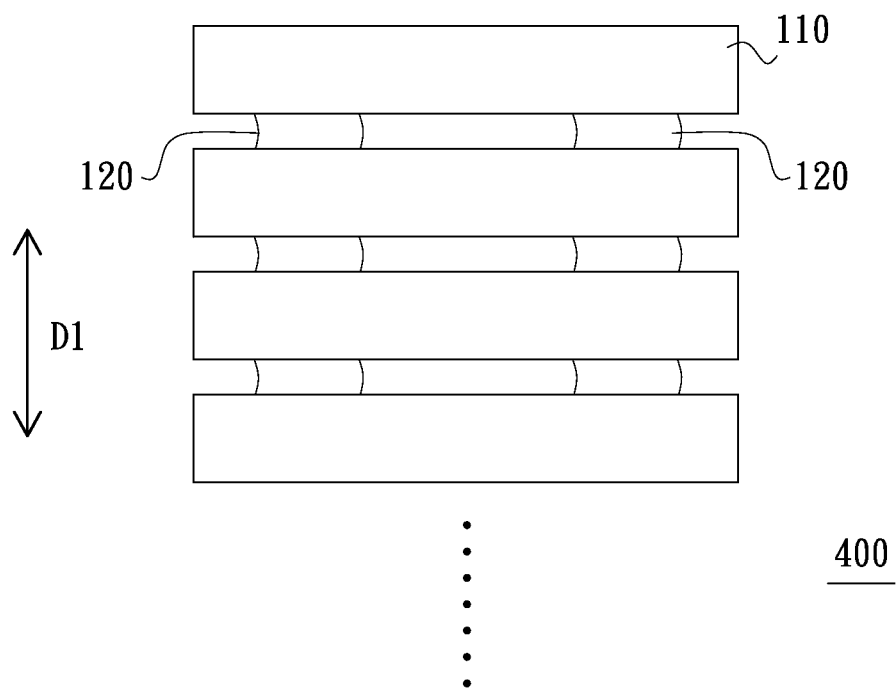
FIG. 5 is a schematic drawing of the electric device with multi-screen according to another embodiment of the invention.
Figure 6:
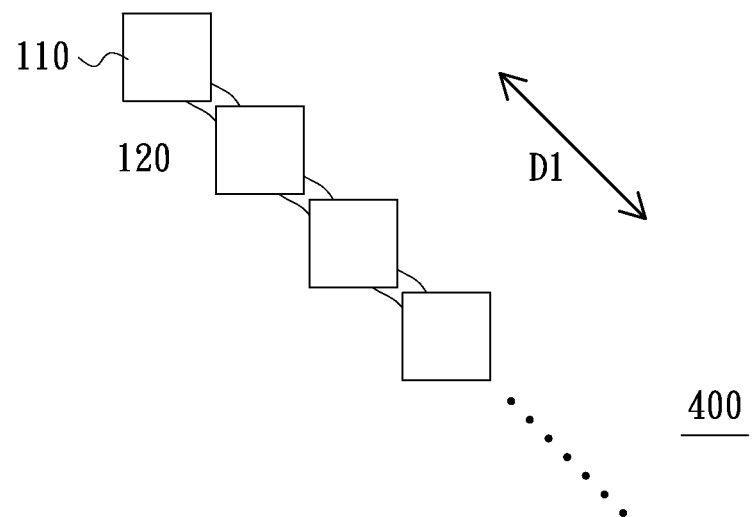
FIG. 6 is a schematic drawing of the electric device with multi-screen according to another embodiment of the invention.
Figure 7:
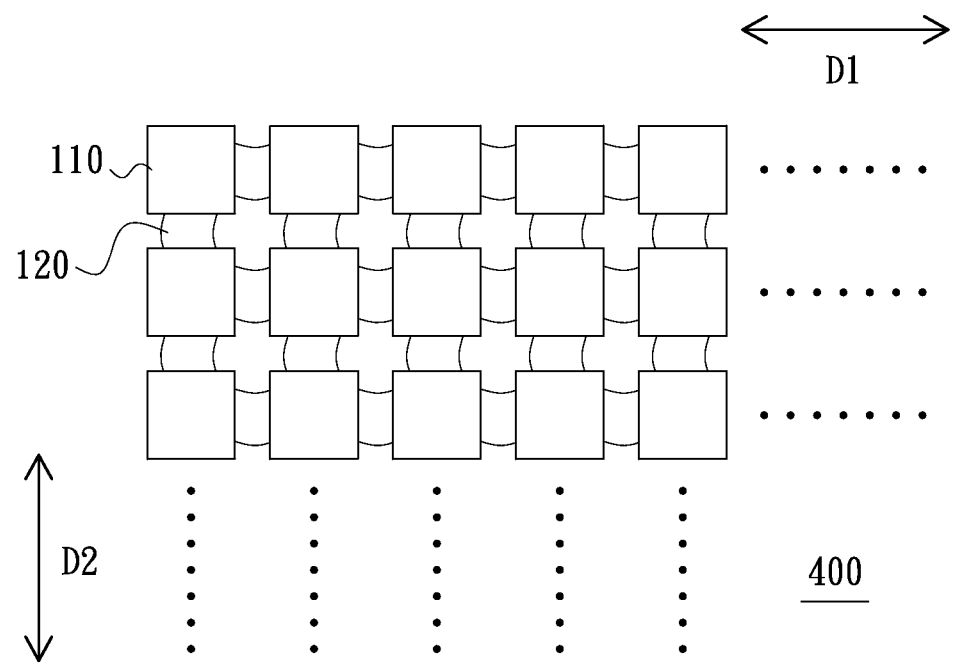
FIG. 7 is a schematic drawing of the electric device with multi-screen according to another embodiment of the invention.

The display modules 110 are not restricted to be connected to each other as a collar in the invention. The display modules 110 can be connected to each other in one-dimension or two-dimension to expand the size of the display screen. For example, the display modules 110 are connected to each other along a first direction D1, wherein the first direction D1 may be horizontal direction (as shown in FIG. 4), vertical direction (as shown in FIG. 5) or a direction along an angle with horizontal direction (as shown in FIG. 6). Furthermore, the display modules 110 may be connected to each other along the first direction D1 and the second direction D2 at the same time, as shown in FIG. 7. In this embodiment, the first direction D1 is perpendicular to the second direction D2. However, the invention is not limited hereto.

Accordingly, the electric device with multi-screen 400 uses the flexible printed circuit boards 120 to connect the small-size display modules 110 to a big-size display screen. The display modules 110 may display different images respectively for satisfying various purposes. Also, the display modules 110 may display part of single image respectively for displaying the single image by the electric device with multi-screen 400.

In addition, the display panels 114 may be reflective display panels without using backlight source, such as flexible electro-phoretic display panel and electro-wetting display panel, or micro electro-mechanical system display panel with high reflectivity. The display panels 114 may be the same type or different types, and the types of the display panels are not limited in the invention.

Figure 8:
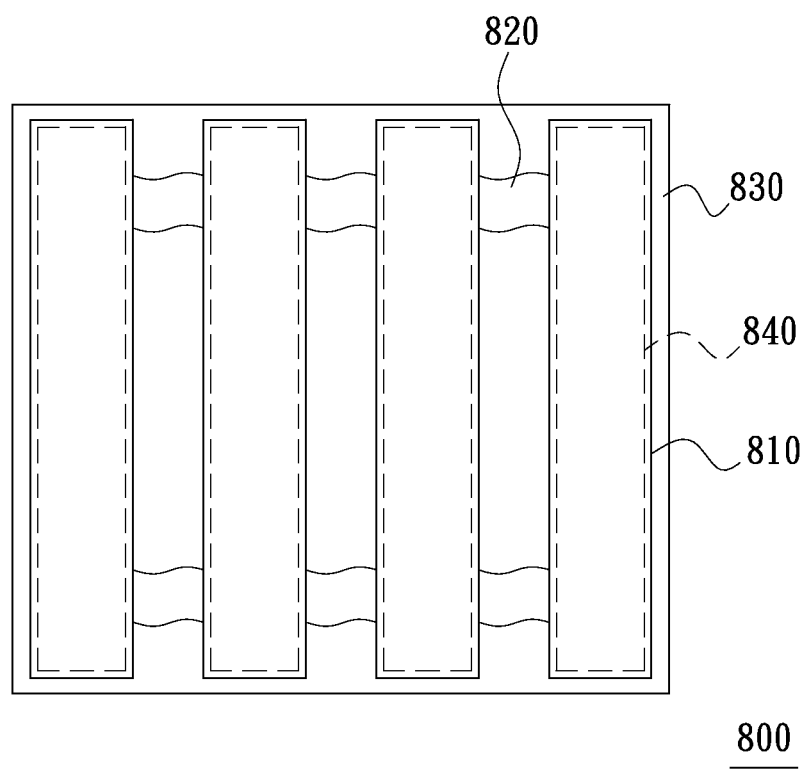
FIG. 8 is a schematic drawing of the electric device with multi-screen according to another embodiment of the invention.

FIG. 8 is a schematic drawing of the electric device with multi-screen according to another embodiment of the invention. Referring to FIG. 8, the electric device with multi-screen 800 comprises a plurality of display modules 810, a plurality of flexible printed circuit boards 820, a flexible substrate 830 and a plurality of driving circuits 840. The material of the flexible substrate 830 may be metal sheet or plastic.

In this embodiment, each display module 810 is a display panel and the driving circuits 840 are separately disposed on the flexible substrate 830. The display modules 810 are disposed above the corresponding driving circuit 840 and electrically connected thereto. Moreover, the display modules 810 are electrically connected to each other by flexible printed circuit boards 820.

Figure 9A:
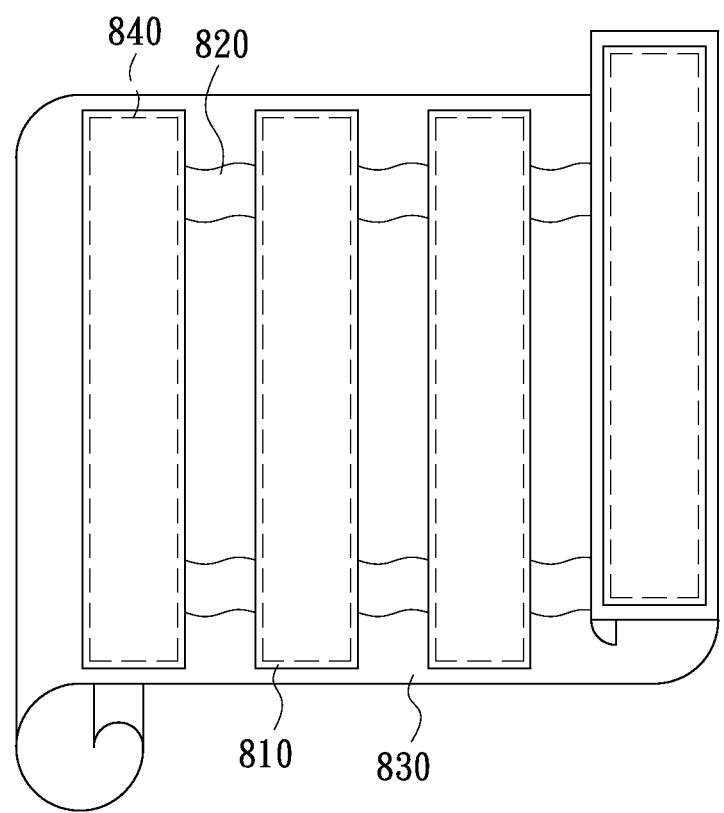
FIG. 9A is a schematic drawing of the bending electric device with multi-screen according to another embodiment of the invention.
Figure 9B:
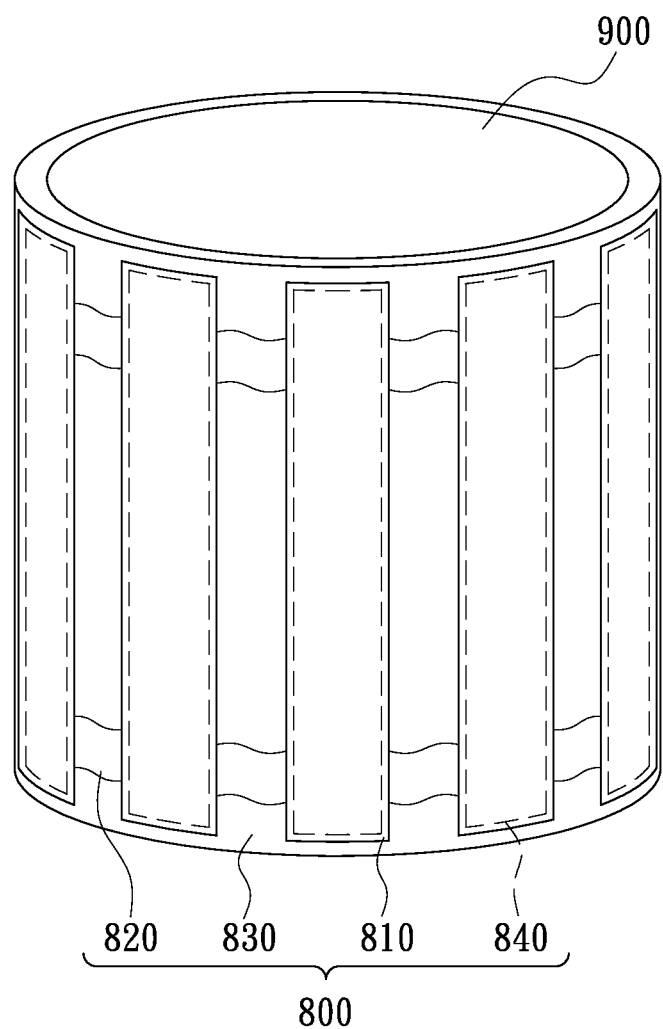
FIG. 9B is a schematic drawing of the electric device with multi-screen adhered on the surface of a thick tube-shape object according to another embodiment of the invention.
Figure 10:
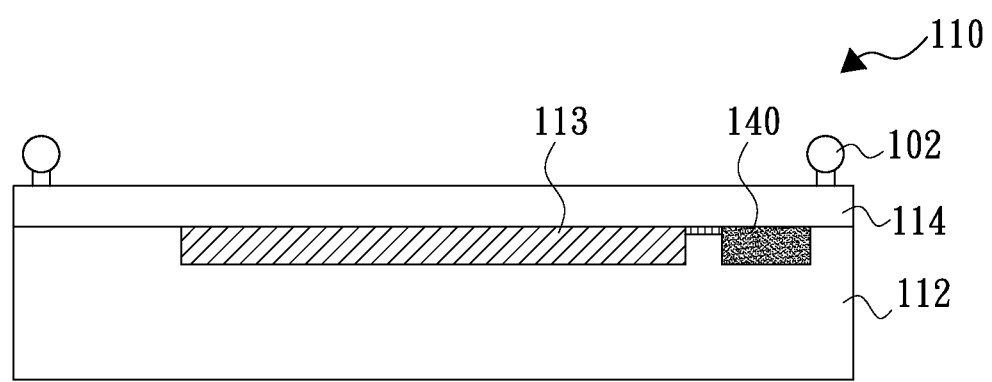
FIG. 10 is a schematic cross-sectional view of the display module of the electric device with multi-screen according to another embodiment of the invention.

Since the display modules 810 are respectively disposed above the corresponding driving circuit 840, that is, the display modules 810 are also separately disposed on the flexible substrate 830, so the electric device with multi-screen 800 can be bent without damaging the display modules 810 and the driving circuits 840, as shown in FIG. 9A. Therefore, the electric device with multi-screen 800 may adhere to any object with curved surface (as the thick tube-shape object 900 shown in FIG. 9B) and consequently has more flexible application.

Some embodiments with accompanying drawings are cited in the following to demonstrate the action of the electric device with multi-screen of the invention.

The display panel of the aforementioned embodiment may be touch panel. For example, user may input signals immediately through the display panel 114 shown in FIG. 2, the driving circuit 113 disposed on the driving circuit boards 112 may drive the display panel 114 based on the signals inputted by user.

Furthermore, the electric device with multi-screen may also comprises at least a radio frequency identification chip 140 disposed on the driving circuit board 112 and electrically connected to the driving circuit 113. That is, the driving circuit 113 may drive the display panel 14 disposed on the driving circuit board 112 according to the signals received by the radio frequency identification chip 140, and the display panel 14 would display the data stored in the signal, such as personal identification or balance of stored-value card.

Besides, all the display modules of the electric device with multi-screen of the invention may be controlled by the same controlling module. It would be described in the following embodiments.

Figure 11:
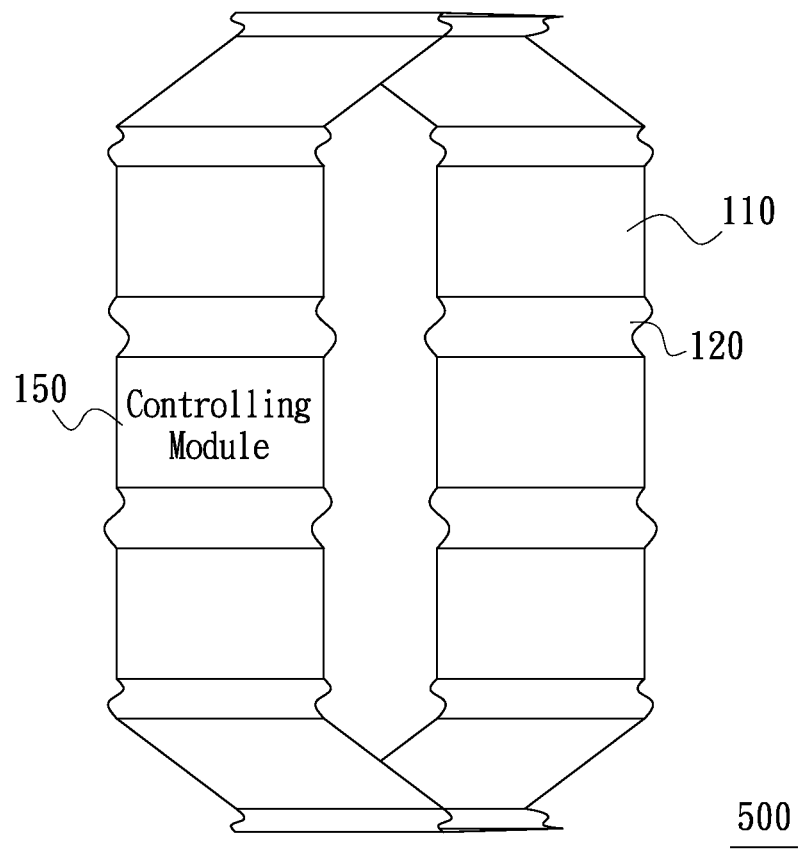
FIG. 11 is a schematic drawing of the electric device with multi-screen according to another embodiment of the invention.

FIG. 11 is a schematic drawing of the electric device with multi-screen according to another embodiment of the invention. Referring to FIG. 11, comparing to the electric device with multi-screen 500 shown in FIG. 1, the electric device with multi-screen of this embodiment further comprises a controlling module 150 electrically connected between two of the display modules 110 through the flexible printed boards 120 and used for outputting a signal used to driving the display modules 110.

The electric device with multi-screen of any one of the aforementioned embodiments may also comprises the controlling module 150, and the connection relationships between the controlling module 150 and the other elements are described in the foregoing paragraph, it is not necessary to say here.

Figure 12:
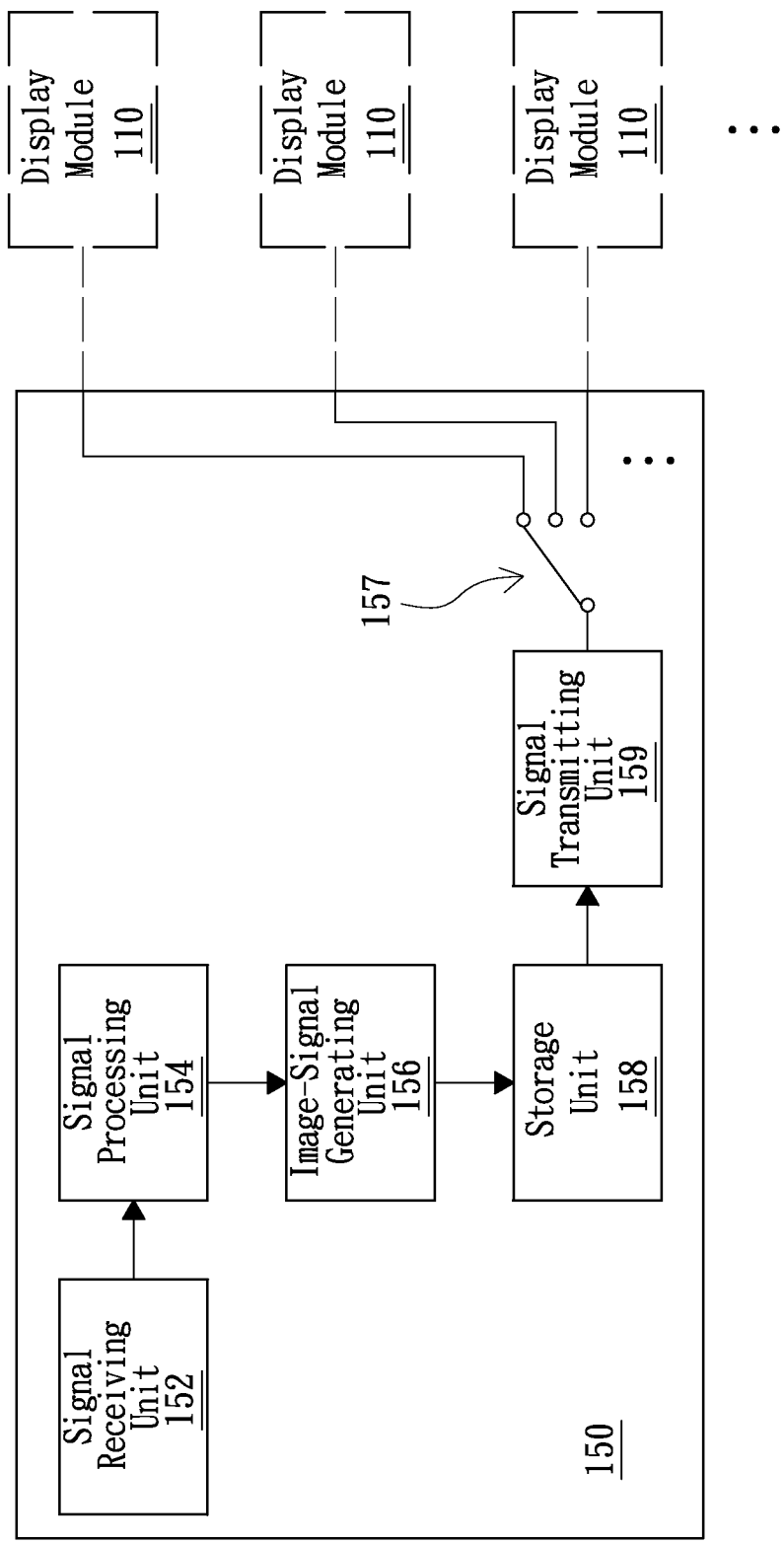
FIG. 12 is a schematic drawing of the controlling module of the electric device with multi-screen according to an embodiment of the invention.

FIG. 12 is a block drawing of the controlling module of the electric device with multi-screen according to an embodiment of the invention. Referring to FIG. 11 and FIG. 12, the controlling module 150 comprises a signal receiving unit 152, a signal processing unit 154, image-signal generating unit 156, at least a storage unit 158 and at least a signal transmitting unit 159. The signal receiving unit 152 is used for receiving a signal, and the signal may be inputted by user through an input device, such as mouse, keyboard or handwriting board. Furthermore, the signal received by the signal receiving unit 152 may be received from the remote devices. Specifically, the signal receiving unit 152 may be a wireless signal receiver receiving signals by, for example, wireless internet, infrared ray or Bluetooth. Additionally, the signal receiving unit 152 also may be a wired signal receiver receiving signals by wired internet or the other removable storage devices.

The signal processing unit 154 is electrically connected to the signal receiving unit 152 for generating a command according to the signal received by the signal receiving unit 152 and outputting the command to the image-signal generating unit 156. The image-signal generating unit 156 is used for generating at least an image-signal based on the command outputted from the signal processing unit 154. The storage unit 156 is electrically connected to the image-signal generating unit 156 for storing the image-signals generated by the image-signal generating unit 156. The signal transmitting unit 159 is used for reading out and transmitting the image-signals to the corresponding display modules 110, and the display modules 110 would display images according to the image-signals.

It should be noted that since the image-signals generated by the image-signal generating unit 156 is stored in the only storage unit 158 of the controlling module 150 of this embodiment, the controlling module 150 further comprises a plurality of switch unit 157 electrically connected to the corresponding one of the display modules 110 respectively. Therefore, the signal transmitting unit 159 may be electrically connected to selective at least one of the display modules 110 and may transmit the image-signals read out to the selective display modules 110. In other words, the display modules 110 of the electric device with multi-screen of the invention may display different images respectively.

Figure 13:
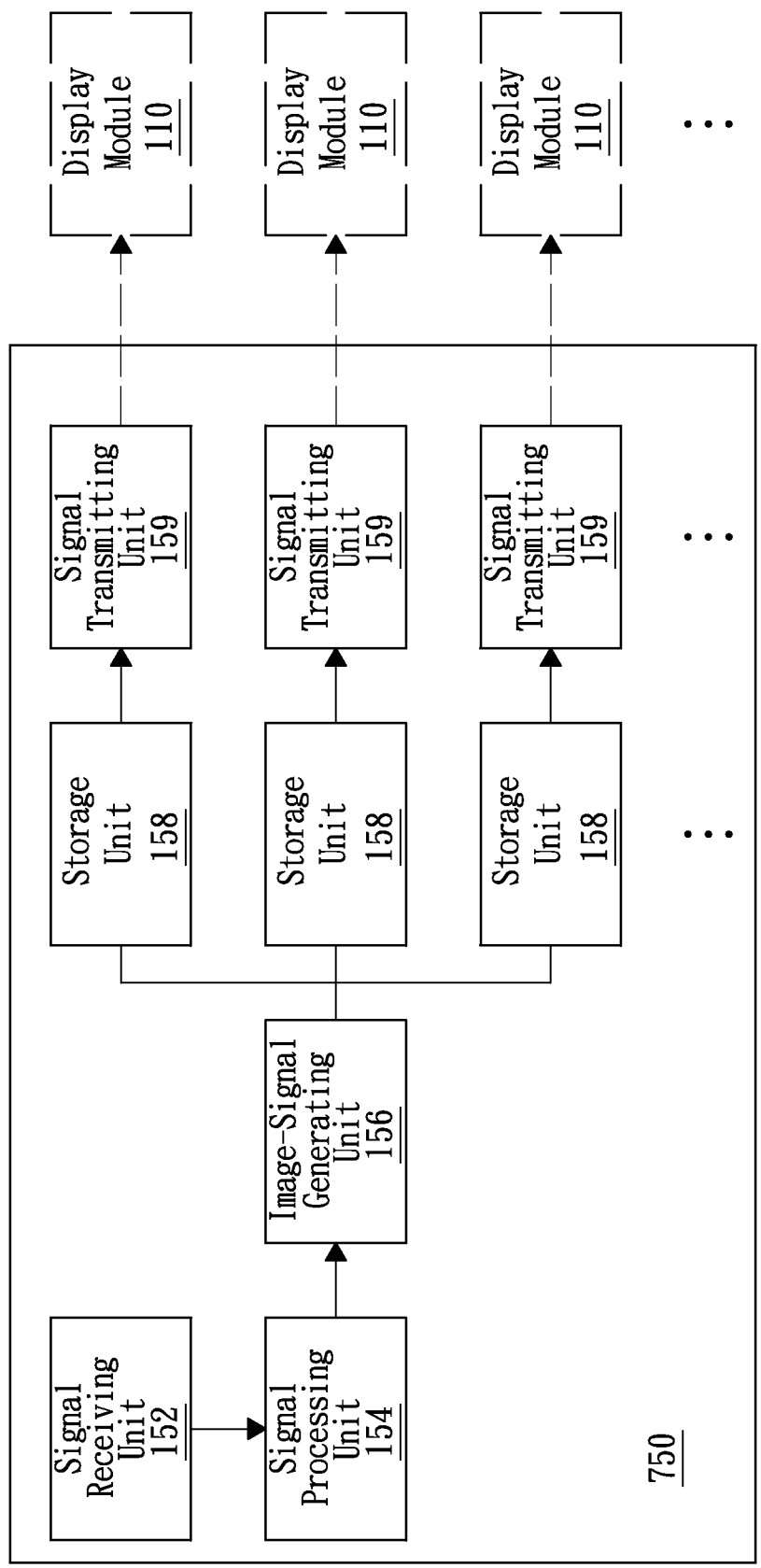
FIG. 13 is a schematic drawing of the controlling module of the electric device with multi-screen according to another embodiment of the invention.

Moreover, in another embodiment of the invention, the controlling module may comprise a plurality of storage units and a plurality of signal transmitting units. It would be described in detail in the following paragraph. FIG. 13 is a block drawing of the controlling module of the electric device with multi-screen according to another embodiment of the invention. Referring to FIG. 13, comparing to the controlling module 150 shown in FIG. 12, the controlling module 750 comprises a plurality of storage units 158 and a plurality of signal transmitting units 159. The storage units 158 and the signal transmitting units 159 are electrically connected to each other one-to-one and each signal transmitting units 159 is electrically connected to one of the display modules 110.

Each storage unit 158 is used for storing the image-signal under being displayed by a particular display module 110. That is, the image-signal under being transmitted to each display module 110 is stored in the corresponding one of the storage units 158. The image-signals may be the same or different.

In summary, in the electric device with multi-screen of the invention, the display modules are connected to each other by a plurality of flexible printed boards for expanding the size of displaying. The display modules may not only display different images respectively for satisfying the various requirements of user, also display a part of an image respectively for comprising each other to the image.

Moreover, the display modules may separately disposed on a single flexible substrate to form an electric device with multi-screen, which may be bent without damaging the display modules and any circuit thereof.

Furthermore, the display modules may be electrically connected to each other by the flexible printed circuit boards to form a ringlike electric device with multi-screen. Therefore, the application of the electric device with multi-screen may be increased.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:
1. An electric device with multi-screen, comprising:
 a plurality of display modules, each of the display modules including a first driving circuit board and a display panel disposed on the first driving circuit board, the first driving circuit board having a first driving circuit electrically connected to the display panel;

at least a second driving circuit board, each disposed between the display modules and having a second driving circuit;

at least a decoration board, each disposed on the second driving circuit board to entirely cover an upper surface of the second driving circuit and an upper surface of the second driving circuit board; and a plurality of flexible printed circuit boards physically connected between the display modules and the second driving circuit board, and electrically connected to the display modules and the second driving circuit board, wherein each of the display panel and the decoration board is attachable to and detachable from the first driving circuit board and the second driving circuit board.

2. The electric device with multi-screen as recited in claim 1, further comprising a controlling module connected between two of the flexible printed circuit boards, the controlling module comprising:

a signal receiving unit, used for receiving an input signal;

a signal processing unit, electrically connected to the signal receiving unit for generating a command based on the input signal;

an image signal generating unit, electrically connected to the signal processing unit for generating at least an image signal based on the command;

at least a storage unit, electrically connected to the image signal generating unit for storing the image signal; and at least a signal transmitting unit, electrically connected to the storage unit for reading the image signal stored in the storage unit and transmitting the image signal to the corresponding one of the display modules.

3. The electric device with multi-screen as recited in claim 2, wherein the controlling module further comprises a switch unit, used to electrically connected the signal transmitting unit to one of the display modules selectively.

4. The electric device with multi-screen as recited in claim 2, wherein the controlling module comprises a plurality of storage units and a plurality of signal transmitting units, each signal transmitting unit is electrically connected to the corresponding one of the storage units.

5. The electric device with multi-screen as recited in claim 2, wherein the signal receiving unit is wireless signal receiver.

6. The electric device with multi-screen as recited in claim 2, wherein the signal receiving unit is wired signal receiver.

7. The electric device with multi-screen as recited in claim 1, wherein the display modules comprise at least a reflective display panel.

8. The electric device with multi-screen as recited in claim 7, wherein the at least a reflective display panel comprises electro-phoretic display panel, electro-wetting display panel or micro electro-mechanical system display panel.

9. The electric device with multi-screen as recited in claim 1, wherein the display panels comprise at least one flexible display panel.

10. The electric device with multi-screen as recited in claim 1, wherein the display panels comprise at least one touch panel.

11. The electric device with multi-screen as recited in claim 1, further comprising a radio frequency identification chip, disposed on one of the first driving circuit boards, and electrically connected to the driving circuit of the first driving circuit board.

12. The electric device with multi-screen as recited in claim 1, wherein the display modules and the second driving circuit board are connected as a collar by the flexible printed circuit boards.

* * * * *